United States Patent [19]

Torazawa et al.

[11] Patent Number: 5,304,819
[45] Date of Patent: Apr. 19, 1994

[54] LIGHT-ACTIVATED SEMICONDUCTOR DEVICE HAVING LIGHT-EMITTING ELEMENTS, LIGHT-RECEIVING ELEMENTS AND OUTPUT ELEMENTS

[75] Inventors: Hiroyasu Torazawa; Kenji Mizuuchi; Kazuo Hagimura, all of Tokyo, Japan

[73] Assignee: Oki Electric Industry Co., Ltd., Minato, Japan

[21] Appl. No.: 81,124

[22] Filed: Jun. 25, 1993

[30] Foreign Application Priority Data

Jun. 29, 1992 [JP] Japan .................................. 4-171226
Jan. 18, 1993 [JP] Japan .................................. 5-005999

[51] Int. Cl.$^5$ ...................... H01L 31/12; H01L 31/16
[52] U.S. Cl. ........................................ 257/82; 257/81; 257/83; 257/723
[58] Field of Search ...................... 257/80, 81, 82, 83, 257/99, 723, 433

[56] References Cited

U.S. PATENT DOCUMENTS

| | | | |
|---|---|---|---|
| 4,794,431 | 12/1988 | Park | 257/82 |
| 4,894,699 | 1/1990 | Hayashi et al. | 257/435 |
| 4,939,375 | 7/1990 | Walters et al. | 257/659 |

FOREIGN PATENT DOCUMENTS

| | | | |
|---|---|---|---|
| 54-115089 | 7/1979 | Japan | 257/82 |
| 57-76883 | 5/1982 | Japan | 257/82 |
| 63-17569 | 1/1988 | Japan | 257/82 |
| 63-170976 | 7/1988 | Japan | 257/82 |
| 64-48057 | 3/1989 | Japan | 257/82 |
| 2-98178 | 4/1990 | Japan | 257/80 |
| 3-195066 | 8/1991 | Japan | 257/82 |

Primary Examiner—Rolf Hille
Assistant Examiner—Minhloan Tran
Attorney, Agent, or Firm—Spencer, Frank & Schneider

[57] ABSTRACT

The present invention relates to a light-activated semiconductor device comprising light-emitting elements for emitting light respectively, light-receiving elements for producing driving voltages in response to the light respectively and output elements activated in response to the driving voltages respectively. The light-receiving elements are disposed on two planes opposed to each other. The output elements are disposed on their corresponding planes in opposing relationship.

18 Claims, 4 Drawing Sheets

1

LIGHT-ACTIVATED SEMICONDUCTOR DEVICE HAVING LIGHT-EMITTING ELEMENTS, LIGHT-RECEIVING ELEMENTS AND OUTPUT ELEMENTS

CROSS REFERENCE TO RELATED APPLICATION

This application claims the priority of Japanese Patent Application Serial No. 4-171,226, filed Jul. 29, 1992, the subject matter of which is incorporated herein by reference.

BACKGROUND OF THE INVENTION

The present invention relates to a light-activated semiconductor device having light-emitting elements, light-receiving elements and output elements. Each of the light-emitting elements emits light. Each of the light-receiving elements outputs a signal in response to the light emitted from each light-emitting element. The output elements make conductive between two output nodes in response to the signal output from each light-receiving element. The light-emitting elements and the light-receiving elements are of isolation types wherein they are disposed as different semiconductor chips. The present invention relates particularly to a technique for disposing two light-receiving elements and two output elements.

A photocoupler, which has been disclosed in Japanese Utility Model Application Laid-Open No. 1-48057, for example, is known as one for disposing the two light-receiving elements. The disclosed photocoupler has two pairs of light-emitting elements and light-receiving elements. The two light-receiving elements are disposed onto two-divided lead frames in opposing relationship to each other. The light-emitting elements are disposed onto the lead frames interposed between the two light-receiving elements so as to be opposed to the respective light-receiving elements. Thus, the photocoupler having the two light-emitting elements and the two light-receiving elements can be reduced in size.

A solid-state device relay, which has been disclosed in Japanese Utility Model Application Laid-Open No. 63-170976, for example, is known as one for disposing the two output elements. The disclosed solid-state device relay has a light-emitting element, a light-receiving element and two output elements. The light-receiving element is connected to a tab of a lead frame. The two output elements are provided at both ends of the light-receiving element. The two output elements are respectively electrically connected (wire-connected) to their corresponding tabs. Each of the output elements is of a metal oxide semiconductor (MOS) field effect transistor chip. Thus, a wiring step for assembling the solid-state device relay is simplified by using tabs.

OBJECTS AND SUMMARY OF THE INVENTION

It is an object of the present invention to dispose two light-receiving elements and two output elements so as to be mounted in a light-activated semiconductor device having the same size as that of a light-activated semiconductor device having only one output element.

It is another object of the present invention to dispose two output elements each having the same space as an occupied space on one plane in which a single output element employed in a light-activated semiconductor device having two light-receiving elements and the output element, is disposed.

According to one aspect of the present invention, for achieving the above objects, there is provided a light-activated semiconductor device comprising two light-receiving elements provided in upper and lower positions and two output elements disposed on the same plane with the light-receiving elements in opposing relationship.

DETAILED DESCRIPTION OF THE PREFERRED EMBODIMENTS

Figure 1A:
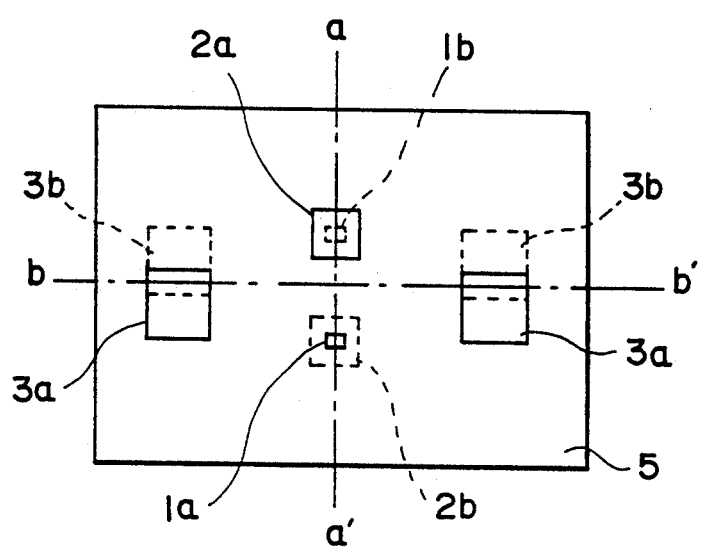
FIGS. 1(a)–1(c) are the views showing the layout of semiconductor elements employed in a light-activated semiconductor device according to a first embodiment of the present invention.

Preferred embodiments of the present invention will hereinafter be described in detail with reference to FIGS. 1 through 5. Incidentally, common elements of structure, which are shown in the respective drawings and whose functions and operations are respectively identical to one another, are identified by like reference numerals.

Each of light-activated semiconductor devices of the present invention, which are shown in FIGS. 1 through 3, is of a two-channel type light-activated semiconductor device having two pairs of light-emitting elements and light-receiving elements and two pairs of output elements.

A light-activated semiconductor device of the present invention, which is illustrated in FIG. 4, is of one example having a light-emitting element, two light-receiving elements and two pairs of output elements.

Figure 5:
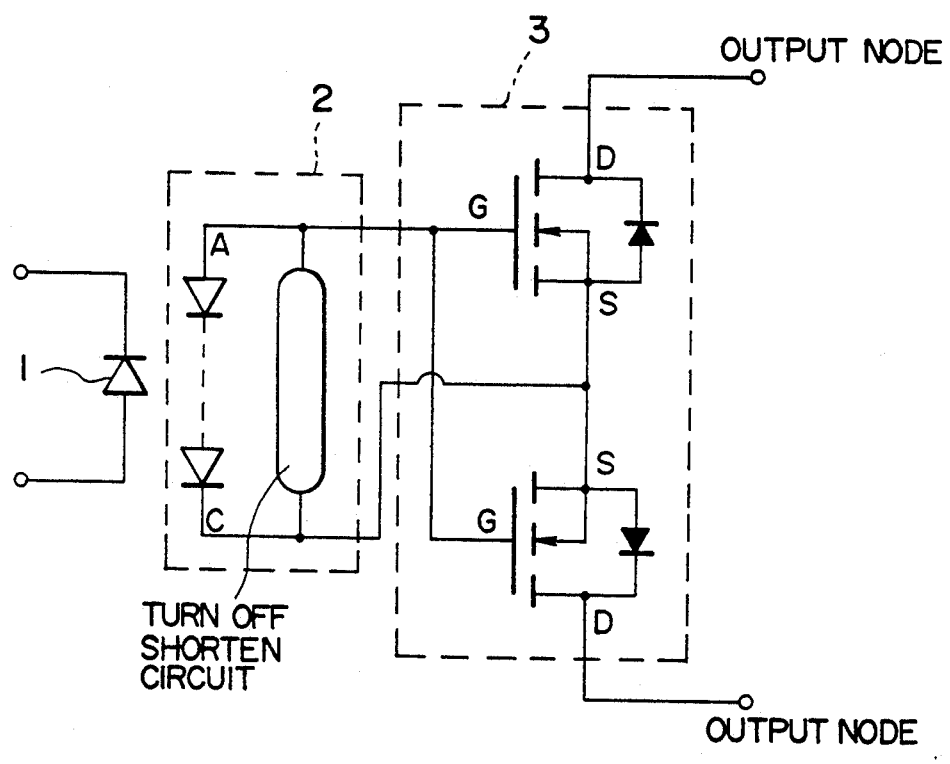
FIG. 5 is a circuit diagram showing a partial circuit common to each of the light-activated semiconductor devices according to the respective embodiments of the present invention.

A partial circuit employed in a light-activated semiconductor device shown in FIG. 5 is of a bidirectional photorelay having two metal oxide semiconductor (MOS) transistors which serve as output elements.

FIG. 1 is a view illustrating the layout of elements used for a light-activated semiconductor device according to a first embodiment of the present invention.

FIG. 1(a) is a view showing the layout of the semiconductor elements as seen from the upper surface of the light-activated semiconductor device. In the same drawing, the elements disposed on the upper surface side are indicated by solid lines and the elements disposed on the lower surface side are indicated by broken lines.

As is apparent from the drawing, a light-emitting element 1a, a light-receiving element 2a and a pair of output elements 3a are provided on the upper surface side in the first embodiment. Further, a light-emitting element 1b, a light-receiving element 2b and a pair of output elements 3b are disposed on the lower surface side. The two pairs of output elements 3a and 3b are divided into two regions.

Figure 1B:
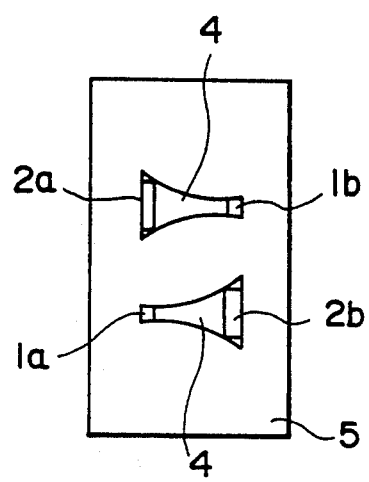
Figure 1C:
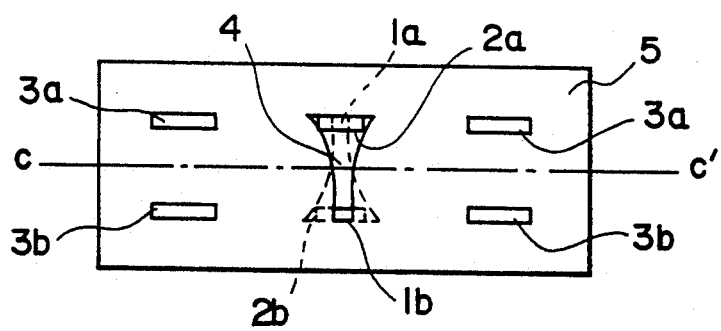

FIG. 1(b) is a view showing the layout of the semiconductor elements in the form of a cross section taken along line a—a' of FIG. 1(a). Further, FIG. 1(c) is a view illustrating the layout of the semiconductor elements in the form of a cross section taken along line b—b' of FIG. 1(a).

In the first embodiment, as is apparent from these drawings, transparent resins 4 formed by filling are respectively disposed between the light-emitting element 1a and the light-receiving element 2b and between the light-emitting element 1b and the light-receiving element 2a. The transparent resins 4 are respectively separated from each other and form two pairs of light-emitting elements and light-receiving elements. The two pairs of output elements 3a and 3b are respectively disposed on the upper and lower sides and disposed within two regions between which the two pairs of light-emitting elements and light-receiving elements are interposed.

A molding resin 5 seals spaces between the pair of light-emitting element 1a and light-receiving element 2b and the pair of light-emitting element 1b and light-receiving element 2a and seals the peripheries of the transparent resins 4 and the respective elements. The light-activated semiconductor device is formed in this way.

FIG. 2 is a plan view showing the configuration of the light-activated semiconductor device according to the first embodiment of the present invention.

Figure 2A:
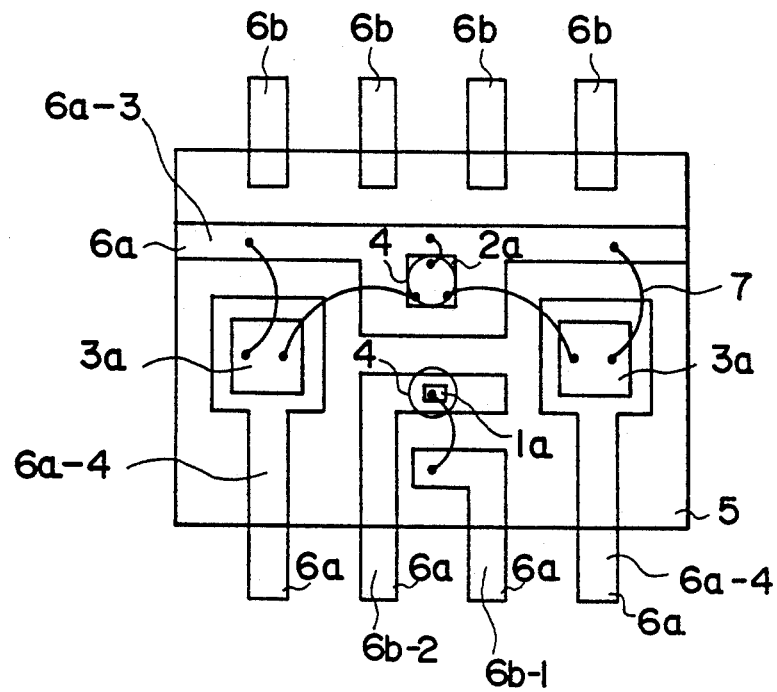
FIGS. 2(a) and 2(b) are the views showing the configuration of the light-activated semiconductor device shown in FIG. 1.
Figure 2B:
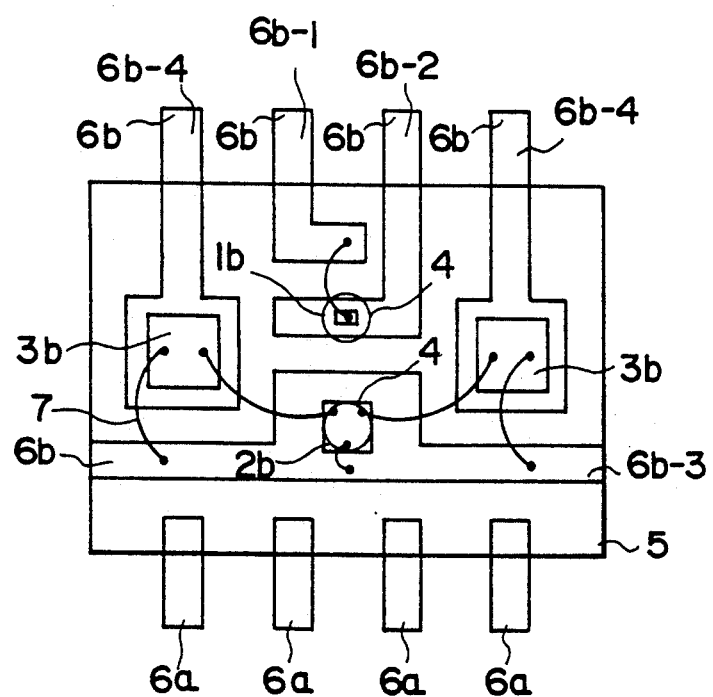

FIG. 2(a) is a plan view illustrating the configuration of the light-activated semiconductor device in a state in which a cross section taken along line c—c' of FIG. 1(c) is seen from below. FIG. 2(b) is a plan view showing the configuration of the light-activated semiconductor device in a state in which the cross section taken along line c—c' of FIG. 1(c) is seen from above.

In the first embodiment, as is apparent from these drawings, an upper lead frame 6a has respective elements 1a, 2a and 3a mounted thereon. On the other hand, a lower lead frame 6b has respective elements 1b, 2b and 3b mounted thereon. The elements 1a, 1b, 2a, 2b, 3a and 3b are respectively electrically connected to one another through conductors or wires 7 and the upper and lower lead frames 6a and 6b. The two pairs of output elements 3a (3b) are mounted in their corresponding tabs 6a-4 (6b-4). The tabs 6b-4 (6a-4) are separately disposed within two regions between which the two pairs of light-emitting elements and light-receiving elements are interposed. The first embodiment will hereinafter be described in detail with reference to FIG. 5.

FIG. 5 shows one example of the circuit of the bidirectional photorelay having the two metal oxide semiconductor (MOS) transistors which serve as the output elements of the light-activated semiconductor device in particular.

The light-emitting element 1a (1b) is of a light-emitting diode, for example. The anode of the light-emitting diode is electrically connected to an anode terminal 6a-1 (6b-2) through the wire 7. The cathode of the light-emitting diode is electrically directly connected to a cathode terminal 6a-2 (6b-2).

The light-receiving element 2b (2a) comprises a photodiode group and a turn off shorten circuit electrically connected in parallel with the photodiode group, for example. The photodiode group is formed by series-connecting a plurality of photodiodes to one another. The cathode of the photodiode group is electrically connected via the wire 7 to a tab 6b-3 (6a-3) having the light-receiving element 2b (2a) mounted thereon.

The output elements 3b (3a) comprise two series-connected vertical diffusion MOS (VMOS) transistors. Each of the VMOS transistors has a characteristic reduced in inverse proportion to the magnitude of its occupied space (i.e., causes an increase in a conducting (ON) resistance between output nodes). The sources of the VMOS transistors are electrically connected to the tab 6b-3 (6a-3) through the wires 7. The gates of the VMOS transistors are electrically directly connected to the anode of the photodiode group of the light-receiving element 2b (2a) through the wires 7. Further, the drains of the VMOS transistors are electrically directly connected to the tabs 6b-4 (6a-4). Thus, the cathode of the light-receiving element 2b (2a) and the sources of the respective output elements 3b (3a) are electrically connected to one another through the wires 7 and the tab 6b-3 (6a-3).

The tabs 6b-4 (6a-4) are drawn outwardly from the molding resin 5 as output nodes.

The operation of the light-activated semiconductor device will now be described below.

The light-emitting element 1a (1b) emits light when driving current flows between the anode terminal 6a-1 (6b-2) and the cathode terminal 6a-2 (6b-2).

The light-receiving element 2b (2a) receives or senses the emitted light through the transparent resins 4. Further, the light-receiving element 2b (2a) produces a driving voltage (power) corresponding to the energy of the received light.

When the driving voltage is supplied between the gates and sources of the respective output elements 3b (3a), the output elements 3b (3a) electrically make both output nodes (i.e., the respective regions corresponding to the tab 6b-3 (6a-3) divided into the two regions) conductive (ON).

Incidentally, the turn off shorten circuit of the light-receiving element 2b (2a) is used to shorten a turn off time interval from the time when the light-emitting element 1a (1b) is turned OFF to the time when the driving of the output elements 3b (3a) is completely brought to an OFF state (i.e., the time when the output nodes are made nonconductive).

The first embodiment shown in FIGS. 1 and 2 shows the case where the output elements divided into the two regions are disposed in a separated state within the two regions between which the two pairs of light-emitting elements and light-receiving elements are interposed. As an alternative, there is known one shown in FIG. 3, for example. Such a light-activated semiconductor device will be described below with reference to FIG. 3.

FIG. 3 is a view illustrating the layout of regions for semiconductor elements employed in a light-activated semiconductor device according to a second embodiment of the present invention.

Figure 3A:
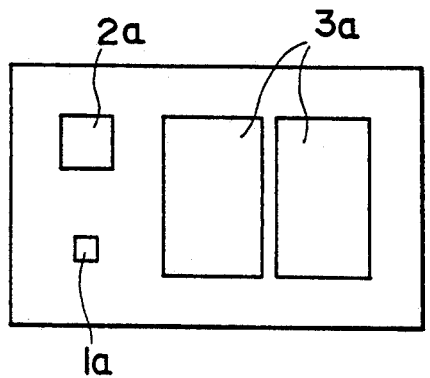
FIGS. 3(a) and 3(b) are the views illustrating the layout of regions for semiconductor elements employed in a light-activated semiconductor device according to a second embodiment of the present invention.
Figure 3B:
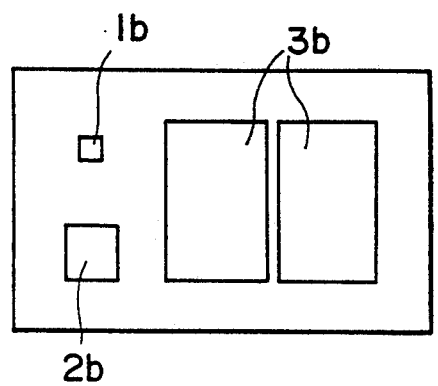

FIG. 3(a) is a plan configurational view showing regions for laying out respective elements mounted on an unillustrated upper lead frame. FIG. 3(b) is a plan configurational view illustrating regions for laying out respective elements mounted on an unillustrated lower lead frame.

Although the second embodiment is not shown in FIG. 3, respective elements 1a, 1b, 2a, 2b, 3a and 3b are identical in function and operation to those employed in the first embodiment. In the present embodiment, the description of common elements of structure will be omitted.

In the second embodiment, as is apparent from these drawings, each of regions for the output elements 3a and 3b is arranged only on one side of each of two pairs of light-emitting elements and light-receiving elements without interposing each of the two pairs of light-emitting elements and light-receiving elements between the regions. This arrangement can be applied to a light-activated semiconductor device having a single region alone even if one output element is not separated into two regions. For example, there is known a unidirectional type light-activated MOS transistor relay wherein one output element is made up of one VMOS transistor, for example.

Each of the first and second embodiments shown in FIGS. 1 through 3 shows a two-channel type light-activated semiconductor device having two pairs of light-emitting elements and light-receiving elements provided in opposing relationship to the light-emitting elements, and two output elements separately disposed in two regions and electrically connected to one another. However, as an alternative to this type of light-activated semiconductor device, there is known one shown in FIG. 4, for example. Such a light-activated semiconductor device will be described below with reference to FIG. 4.

FIG. 4 is a view illustrating the layout of semiconductor elements employed in a light-activated semiconductor device according to a third embodiment of the present invention.

Although the third embodiment is not shown in FIG. 4, respective elements 1a, 2a, 2b, 3a and 3b are identical in function and operation to those employed in the first embodiment. In the present embodiment, the description of common elements of structure will be omitted.

Figure 4A:
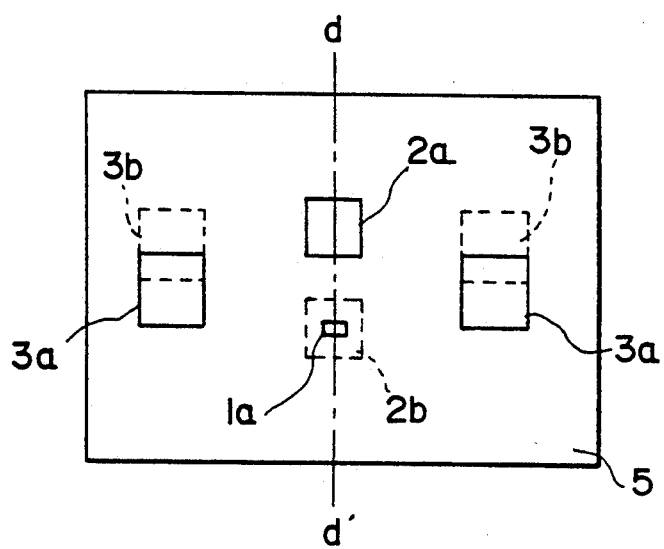
FIGS. 4(a) and 4(b) are the views depicting the layout of semiconductor elements employed in a light-activated semiconductor device according to a third embodiment of the present invention.

FIG. 4(a) corresponds to FIG. 1(a) and shows the layout of elements as seen from the upper surface of the light-activated semiconductor device similarly to FIG. 1(a). In the same drawing, the elements disposed on the upper surface side are indicated by solid lines and the elements disposed on the lower surface side are indicated by broken lines.

In the third embodiment, as is apparent from the drawing, a light-emitting element 1a, a light-receiving element 2a and a pair of output elements 3a are provided on the upper surface side. Further, a light-receiving element 2b and a pair of output elements 3b are disposed on the lower surface side. The two pairs of output elements 3a and 3b are respectively divided into two regions.

Figure 4B:
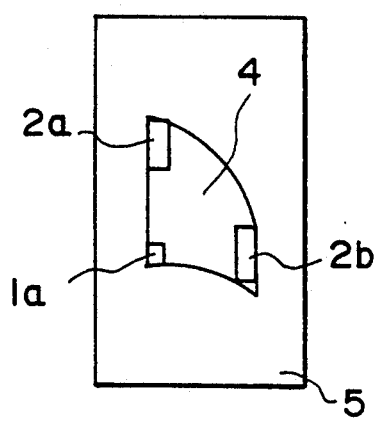

FIG. 4(b) is a view showing the layout of the elements in the form of a cross section taken along line d—d' of FIG. 4(a).

In the third embodiment, as is apparent from these drawings, a transparent resin 4 formed by filling is disposed between the light-emitting element 1a and the light-receiving elements 2a, 2b.

Similarly to the first embodiment as well, the regions for the two pairs of output elements 3a and 3b are divided into two with the two pairs of light-emitting elements and light-receiving elements interposed between the two regions. A molding resin 5 seals one of the two pairs and the output elements 3a and 3b, thereby forming the light-activated semiconductor device.

The present invention is not necessarily limited to the aforementioned embodiments. The respective regions of the output elements 3a and 3b may be provided only on one side of two pairs of light-emitting elements and light-receiving elements without interposing the two pairs of light-emitting elements and light-receiving elements between the regions.

In the respective embodiments, the light-receiving elements and the output elements are respectively used as semiconductor chips different from each other. However, there is known one example in which the light-receiving elements and the output elements are integrally shaped in the form of the same semiconductor chip. In this case, the semiconductor chip for each light-emitting element is disposed on one side of each light-emitting element as in the second embodiment.

As described above, the two sets of output elements are respectively disposed in opposing relationship on the same plane with the two light-receiving elements provided in the upper and lower positions. Therefore, the respective elements are disposed in high density. Thus, two output elements can be mounted in a light-activated semiconductor device having the same size as that of a light-activated semiconductor device having only one output element.

Since the output elements are disposed in the above-described manner, the light-activated semiconductor device having the two output elements can take the same space as an occupied space on one plane in which one output element of the light-activated semiconductor device having that output element alone is disposed. Thus, even if output elements comprised of VMOS transistors, for example, are reduced in characteristic with a reduction in occupied space, two output elements can be mounted in the light-activated semiconductor device having the same size as that of the light-activated semiconductor device having only the one output element.

As in the case of the first and third embodiments, the output elements divided into the two regions are separately disposed in the two regions between which the two pairs of light-emitting elements and light-receiving elements are interposed. Therefore, the upper and lower lead frames whose shapes are identical to each other can be used and conveniently manufactured.

As described in the second embodiment as well, the output elements are respectively disposed only on one side of the two pairs of light-emitting elements and light-receiving elements without interposing the two pairs of light-emitting elements and light-receiving elements therebetween. Therefore, when the transparent resin is injected into the light-activated semiconductor device, the injection of the transparent resin therein may be simply conducted from the other side of the two pairs in a step for filling the light-activated semiconductor device with the transparent resin, for example. Thus, the efficiency of work can be improved.

Having now fully described the invention, it will be apparent to those skilled in the art that many changes and modifications can be made without departing from the spirit or scope of the invention as set forth herein.

What is claimed is:

1. A light-activated semiconductor device comprising:
   light-emitting elements comprising,
      a first light-emitting element for emitting first light therefrom, said first light-emitting element being disposed on a first plane, and a second light-emitting element for emitting second light therefrom, said second light-emitting element being disposed on a second plane opposed to said first plane;

light-receiving elements comprising,
- a first light-receiving element responsive to said first light to produce a first driving voltage, said first light-receiving element being disposed in opposing relationship to said first light-emitting element on the second plane, and
- a second light-receiving element responsive to said second light to produce a second driving voltage, said second light-receiving element being disposed in opposing relationship to said second light-emitting element on the first plane; and output elements comprising,
- a pair of first output elements activated in response to the first driving voltage and disposed on the second plane, and
- a pair of second output elements activated in response to the second driving voltage and disposed in opposing relationship to said pair of first output elements on the first plane.

2. A light-activated semiconductor device according to claim 1, wherein said pairs of first and second output elements are respectively disposed in one region.

3. A light-activated semiconductor device according to claim 1, wherein said pairs of first and second output elements are respectively separately disposed in two regions respectively electrically connected to each other.

4. A light-activated semiconductor device according to claim 3, wherein said pairs of first and second output elements are respectively disposed in regions on both sides, said regions interposing said first and second light-emitting elements therebetween.

5. A light-activated semiconductor device according to claim 3, wherein said pairs of first and second output elements are respectively disposed in the two regions in such a manner that the two separated regions are electrically connected to each other through wires.

6. A light-activated semiconductor device according to claim 1, wherein said first and second light-receiving elements and said pairs of first and second output elements are integrally formed as a semiconductor chip within the first and second planes equal in size to each other.

7. A light-activated semiconductor device according to claim 1, wherein said pairs of first and second output elements respectively comprise VMOS transistors.

8. A light-activated semiconductor device according to claim 1, wherein said first and second light are respectively transmitted to said first and second light-receiving elements through two transparent resins separated from each other and charged.

9. A light-activated semiconductor device according to claim 1, wherein said pairs of first and second output elements are activated so as to make conductive between two output nodes electrically in an nonconducting state.

10. A light-activated semiconductor device comprising:

at least one light-emitting element activated to emit light and disposed on a first plane;

light-receiving elements comprising,
- a first light-receiving element responsive to said light to produce a first driving voltage, said first light-receiving element being disposed in opposing relationship to said light-emitting element on a second plane opposed to the first plane, and
- a second light-receiving element responsive to said light to produce a second driving voltage, said second light-receiving element being disposed in opposing relationship to said first light-receiving element on the first plane; and output elements comprising,
- a pair of first output elements activated in response to the first driving voltage and disposed on the second plane, and
- a pair of second output elements activated in response to the second driving voltage and disposed in opposing relationship to said pair of first output elements on the first plane.

11. A light-activated semiconductor device according to claim 10, wherein said pairs of first and second output elements are respectively disposed in one region.

12. A light-activated semiconductor device according to claim 10, wherein said pairs of first and second output elements are respectively separately disposed in two regions electrically connected to each other.

13. A light-activated semiconductor device according to claim 12, wherein said pair of first output elements is disposed in regions on both sides within the first plane, said regions interposing said light-emitting element therebetween, and said pair of second output elements is disposed in regions on both sides within the second plane, said regions interposing said first light-receiving element therebetween.

14. A light-activated semiconductor device according to claim 12, wherein said pairs of first and second output elements are respectively disposed in the two regions in such a manner that the two separated regions are electrically connected to each other through wires.

15. A light-activated semiconductor device according to claim 10, wherein said first and second light-receiving elements and said pairs of first and second output elements are integrally formed as a semiconductor chip within the first and second planes equal in size to each other.

16. A light-activated semiconductor device according to claim 10, wherein said pairs of first and second output elements respectively comprise VMOS transistors.

17. A light-activated semiconductor device according to claim 10, wherein said light is transmitted to said first and second light-receiving elements through a transparent resin charged.

18. A light-activated semiconductor device according to claim 10, wherein said pairs of first and second output elements are activated so as to make conductive between two output nodes electrically in an nonconducting state.

* * * * *